United States Patent
Lotter et al.

(10) Patent No.: US 10,331,183 B1
(45) Date of Patent: Jun. 25, 2019

(54) ACOUSTIC ENERGY MITIGATION FOR MECHANICAL DRIVES USING BAFFLE

(71) Applicant: Cisco Technology, Inc., San Jose, CA (US)

(72) Inventors: Eric M. Lotter, Gilroy, CA (US); Hong T. Huynh, Fremont, CA (US); David L. Duell, Scotts Valley, CA (US); Daniel B. Oliver, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/928,899

(22) Filed: Mar. 22, 2018

(51) Int. Cl.
*H05K 7/00* (2006.01)
*H05K 5/00* (2006.01)
*G06F 1/20* (2006.01)
*G10K 11/16* (2006.01)
*H05K 7/20* (2006.01)

(52) U.S. Cl.
CPC ............. *G06F 1/20* (2013.01); *G10K 11/161* (2013.01); *H05K 7/20145* (2013.01)

(58) Field of Classification Search
CPC ....................................................... H05K 5/00
See application file for complete search history.

(56) References Cited

U.S. PATENT DOCUMENTS

| 6,400,568 B1* | 6/2002 | Kim ......................... G06F 1/20 165/104.33 |
| 6,906,920 B1 | 6/2005 | Whitted |
| 2005/0041392 A1* | 2/2005 | Chen .................. H05K 7/20727 361/695 |

OTHER PUBLICATIONS

Cisco Public, "Cisco UCS C480 M5 Rack Server," Oct. 2017, 5 pages.

* cited by examiner

*Primary Examiner* — Jerry Wu
(74) *Attorney, Agent, or Firm* — Patterson + Sheridan, LLP

(57) ABSTRACT

A computing device comprises an air moving device operable to produce an airflow that removes heat from one or more components that are arranged upstream from the air moving device. The airflow corresponds to an acoustic energy signature. The computing device further comprises one or more mechanical drives that are arranged downstream from the air moving device, and a baffle comprising a first surface and an opposing second surface. The baffle is disposed between the air moving device and the one or more mechanical drives. The baffle defines a plurality of perforations extending between the first surface and the second surface, and the plurality of perforations are dimensioned and arranged to mitigate one or more predefined components of the acoustic energy signature of the airflow while permitting a first portion of the airflow to pass through the baffle to remove heat from the one or more mechanical drives.

20 Claims, 8 Drawing Sheets

ACOUSTIC ENERGY MITIGATION FOR MECHANICAL DRIVES USING BAFFLE

TECHNICAL FIELD

Embodiments presented in this disclosure generally relate to techniques for mitigating acoustic energy for mechanical drives using a baffle.

BACKGROUND

Computing devices such as servers continue to include increasing amounts of storage. In some cases, hard disk drives (HDDs) having rotating magnetic media may be preferred to solid-state drives (SSDs) due to a lower cost for a given capacity. Increasing the number of HDDs within a fixed volume of a computing device may require the HDDs to be placed in sub-optimal locations, such as near air moving device(s) of the computing device. However, the acoustic energy from the air moving device(s) can affect the platters, read-heads, and/or other mechanical components of the HDDs, resulting in a substantial performance degradation. Additionally, it may be beneficial to provide an airflow to remove heat from the HDDs and keep the HDDs within acceptable temperature limits.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
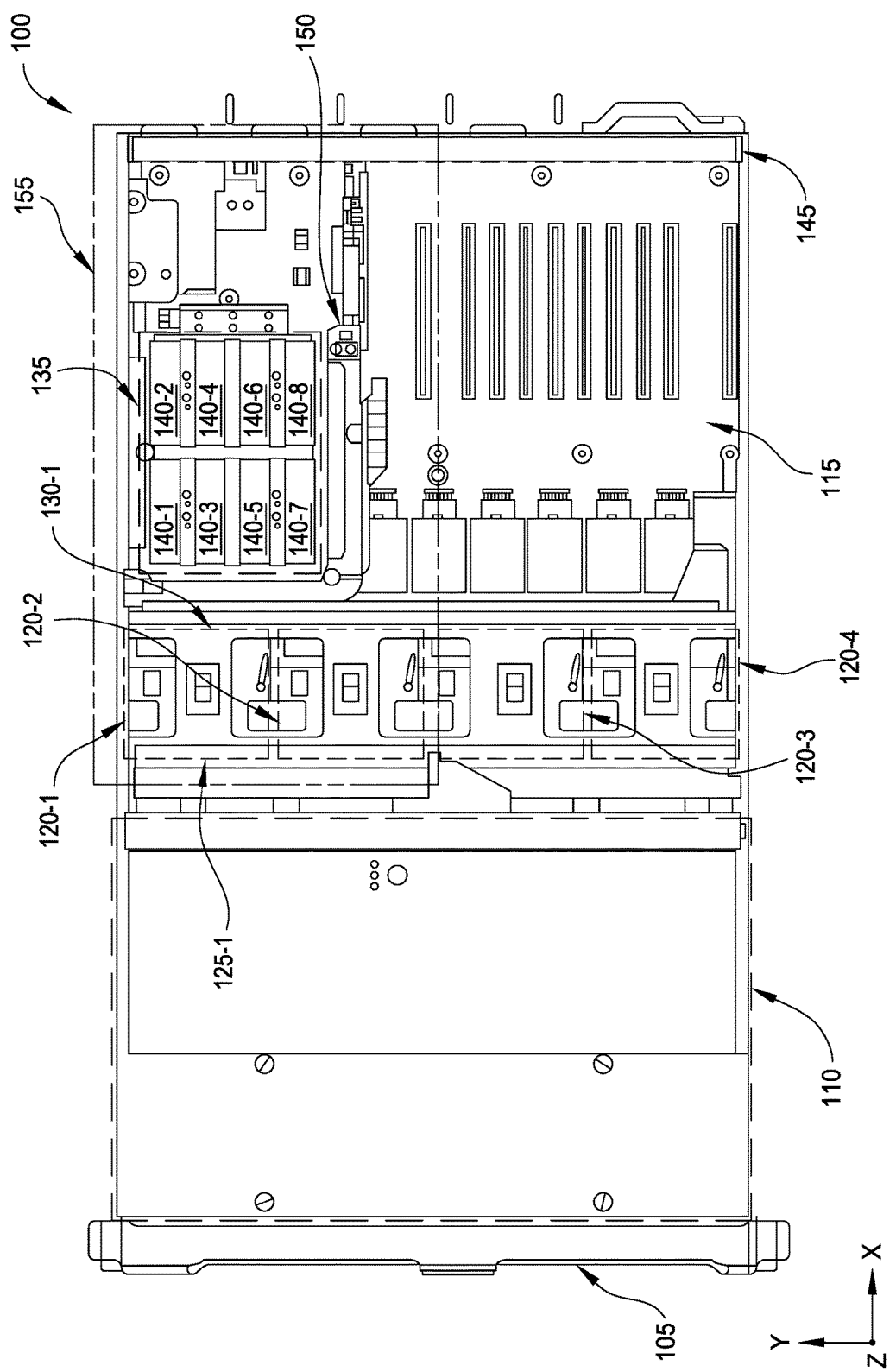
FIG. 1 is a diagram of an exemplary computing device including a baffle, according to one or more embodiments.

One embodiment presented in this disclosure is a computing device comprising an air moving device operable to produce an airflow that removes heat from one or more components of the computing device that are arranged upstream from the air moving device. The airflow corresponds to an acoustic energy signature. The computing device further comprises one or more mechanical drives that are arranged downstream from the air moving device, and a baffle comprising a first surface and an opposing second surface. The baffle is disposed between the air moving device and the one or more mechanical drives. The baffle defines a plurality of perforations extending between the first surface and the second surface, and the plurality of perforations are dimensioned and arranged to mitigate one or more predefined components of the acoustic energy signature of the airflow while permitting a first portion of the airflow to pass through the baffle to remove heat from the one or more mechanical drives.

Another embodiment presented in this disclosure is a computing device comprising an air moving device operable to produce an airflow within a housing, and one or more components proximately disposed to an inlet of the air moving device, wherein the airflow removes heat from the one or more components. The airflow corresponds to an acoustic energy signature. The computing device further comprises one or more mechanical drives proximately disposed to an outlet of the air moving device, wherein the one or more mechanical drives are connected with a first surface within the housing. The computing device further comprises a baffle that extends between the air moving device and the one or more mechanical drives, wherein the baffle is connected via a compressible damping material with a second surface that is vibrationally isolated from the first surface. The baffle is configured to mitigate one or more predefined components of the acoustic energy signature of the airflow while permitting a first portion of the airflow to pass through the baffle to remove heat from the one or more mechanical drives.

Example Embodiments

According to various embodiments disclosed herein, a computing device comprises an air moving device operable to produce an airflow that removes heat from one or more components of the computing device that are arranged upstream from the air moving device. The airflow corresponds to an acoustic energy signature. The computing device further comprises one or more mechanical drives that are arranged downstream from the air moving device, and a baffle comprising a first surface and an opposing second surface. The baffle is disposed between the air moving device and the one or more mechanical drives. The baffle defines a plurality of perforations extending between the first surface and the second surface, and the plurality of perforations are dimensioned and arranged to mitigate one or more predefined components of the acoustic energy signature of the airflow while permitting a first portion of the airflow to pass through the baffle to remove heat from the one or more mechanical drives.

Beneficially, use of the baffle may provide a desired balance between mitigating the acoustic energy imparted to the airflow from the air moving devices and allowing a sufficient portion of the airflow to pass by the one or more mechanical drives for cooling purposes. Further, the baffle may achieve a suitable performance based on its geometry, and therefore may be implemented without requiring the use of expensive damping materials and techniques.

FIG. 1 is a diagram of an exemplary computing device 100 including a baffle 150, according to one or more embodiments. The computing device 100 may have any suitable implementation. In some embodiments, the computing device 100 comprises a rack mount server.

The computing device 100 comprises a front panel 105. As will be understood by a person of ordinary skill in the art, the front panel 105 may comprise various buttons, indicators, and/or ports providing external connectivity for the computing device 100. In some embodiments, the front panel 105 defines one or more vents providing an air intake into the computing device 105. In some embodiments, the front panel 105 is included in a housing of the computing device 100 that is configured to enclose and protect one or more components 110 of the computing device 100. Generally, the one or more components 110 may include computer processors, memory, and/or other electronic components.

The computing device 100 may further comprise a circuit board 115 that is communicatively coupled with the one or more components 100. In some embodiments, the circuit board 115 may comprise one or more slots for expansion cards. In one embodiment, the circuit board 115 comprises a motherboard (or main printed circuit board (PCB)) of the computing device 100. In another embodiment, the circuit board 115 comprises a backplane or daughterboard that is communicatively coupled with the motherboard.

The computing device 100 comprises one or more air moving devices 120-1, 120-2, 120-3, 120-4 that are each configured to produce an airflow through the computing device 100. The air moving devices 120-1, 120-2, 120-3, 120-4 may have any suitable implementation, such as electrically-powered fans. The air moving device 120-1 comprises an inlet 125-1 and an outlet 130-1 defining a direction of air propulsion through the air moving device 120-1; the air moving devices 120-2, 120-3, 120-4 may have a comparable configuration. The airflow produced by the air moving device 120-1 corresponds to an acoustic energy signature, which may depend on the configuration of the air moving device 120-1. For example, the acoustic energy signature may include one or more of a magnetic noise component, a mechanical noise component, a viscous or friction noise component, a windage noise component, and an electric or electronic noise component associated with operating the air moving device 120-1. The acoustic energy signature may also depend on the interaction of the airflow with the air moving device 120-1, e.g., eddies that are created when the airflow passes through the air moving device 120-1. Notably, component(s) of the acoustic energy signature may have content occurring at one or more frequencies, which may be overlapping with content from other component(s) of the acoustic energy signature. Further, the configuration of the air moving device 120-1 may be dynamically adapting during operation of the air moving device 120-1, e.g., as a fan speed changes responsive to temperature changes of the one or more components 110.

In some embodiments, air from the ambient environment may be drawn into the computing device 100 through vents in the front panel 105 and pass by the one or more components 110. As the air passes by the one or more components 110, the airflow removes heat from the one or more components 110. The airflow may be propelled through the air moving devices 120-1, 120-2, 120-3, 120-4, and may exit the computing device 100 through vents 145.

In some embodiments, the computing device 100 comprises a drive cage 135 that is configured to support and/or provide a predefined arrangement to a plurality of mechanical drives 140-1, 140-2, . . . , 140-8. As discussed herein, a "mechanical drive" represents a storage device of the computing device 100 that uses mechanically moving parts such as magnetic tape(s), magnetic disk(s), and/or optical disc(s). In some embodiments, the mechanical drives 140 are implemented as hard disk drives (HDDs) that use a mechanical arm with a read/write head to move around and read information from various locations on a storage platter.

In some embodiments, the drive cage 135 is connected with a surface other than the circuit board 115 and is vibrationally isolated from the circuit board 115. Additional implementation details for the drive cage 135 are discussed below with respect to FIG. 3.

As shown, the drive cage 135 and the plurality of mechanical drives 140-1, 140-2, . . . , 140-8 are arranged downstream from one or more of the air moving devices 120-1, 120-2, 120-3, 120-4 (i.e., arranged on the side of the outlet 130-1). While eight mechanical drives 140-1, 140-2, . . . , 140-8 are illustrated, other implementations may include different numbers of mechanical drives. Further, other implementations may omit the drive cage 135, and the mechanical drives 140-1, 140-2, . . . , 140-8 may be positioned downstream from one or more of the air moving devices 120-1, 120-2, 120-3, 120-4.

The computing device 100 further comprises a baffle 150 that extends between one or more of the air moving devices 120-1, 120-2, 120-3, 120-4 and the one or more mechanical drives 140-1, 140-2, . . . , 140-8. The baffle 150 is configured to mitigate one or more predefined components of an acoustic energy signature of the airflow exiting the air moving devices 120-1, 120-2, 120-3, 120-4 while permitting a first portion of the airflow to pass through the baffle 150 to remove heat from the one or more mechanical drives. For example, the baffle 150 may be configured to mitigate one or more of: a magnetic noise component, a mechanical noise component, a viscous or friction noise component, a windage noise component, and an electric or electronic noise component associated with operating the air moving devices 120-1, 120-2, 120-3, 120-4. The baffle 150 may be configured to mitigate a noise component associated with eddies that are created when the airflow passes through the air moving device 120-1. In some embodiments, the baffle 150 may be configured to mitigate acoustic energy occurring at one or more predefined frequencies, which may correspond to (or overlap with) one or more particular components of the acoustic energy signature.

In some embodiments, the baffle 150 defines a plurality of perforations (not shown) that are dimensioned and arranged to mitigate the one or more predefined components of the acoustic energy signature of the airflow while permitting the first portion of the airflow to pass through. In some embodiments, the plurality of perforations are dimensioned and arranged to mitigate one or more frequencies corresponding to resonances or other critical frequencies associated with the one or more mechanical drives 140-1, 140-2, . . . , 140-8.

In some embodiments, the baffle 150 is configured to deflect a second portion of the airflow around the baffle 150 to exit the computing device 100 through one or more of the vents 145. In some embodiments, a first portion of the baffle 150 is substantially perpendicular to a predominant direction of the airflow, and a surface of the baffle 150 is contoured to deflect the second portion. In other embodiments, the first portion of the baffle 150 may be at a non-perpendicular angle relative to the predominant direction of the airflow.

The baffle 150 may be constructed as a monolithic component or as an assembly of multiple components. The baffle 150 may be constructed or formed from any suitable material(s). In one non-limiting example, the baffle 150 is formed of a plastic material such as polycarbonate-acrylonitrile butadiene styrene (PC-ABS). Beneficially, forming the baffle 150 of a plastic material provides a low-cost implementation of the baffle 150, especially when compared with using exotic damping materials.

The baffle 150 may be connected with at least a first surface within the computing device 100. In some embodiments, the baffle 150 is connected with the circuit board 115 via a compressible damping material. In some embodiments, the baffle 150 further comprises one or more compressible features. For example, the compressible damping material and the one or more compressible features may be compressed when a lid component of the housing is installed. Beneficially, the use of the compressible damping material and the one or more compressible features allows the baffle 150 to further dampen acoustic energy included in the airflow.

Further, the baffle 150 may be connected with different surface(s) of the computing device 100 than the one or more mechanical drives 140-1, 140-2, . . . , 140-8 such that the baffle 150 is vibrationally isolated from the one or more mechanical drives 140-1, 140-2, . . . , 140-8. For example, the baffle 150 may be connected with the housing or other structural members of the computing device 100. The baffle 150 may include one or more alignment features and/or retaining features for the connection with the housing of the computing device 100.

The baffle 150 may have a passive implementation or an active implementation. A passive implementation of the baffle 150 may have a static configuration, while an active implementation of the baffle 150 may include one or more features that may be adapted during operation of the computing device 100. In some embodiments, the characteristics of the perforations of the baffle 150 may be adapted. In one non-limiting example, responsive to an increased fan speed and/or an increased temperature of the one or more components 110, the size of the perforations may be reduced and/or the number of perforations reduced. In another non-limiting example, responsive to an increased temperature of the mechanical drives 140-1, 140-2, . . . , 140-8, the size of the perforations may be increased and/or the number of perforations increased to improve airflow through the baffle 150 for removing heat from the mechanical drives 140-1, 140-2, . . . , 140-8. In some embodiments, the baffle 150 may be reoriented relative to the predominant direction of the airflow.

As shown, the baffle 150 extends substantially across the predominant direction of the airflow from the air moving device 120-1, and also extends past the one or more mechanical drives 140-1, 140-2, . . . , 140-8 along the predominant direction of the airflow. In this way, the baffle 150 may be configured to shield the one or more mechanical drives 140-1, 140-2, . . . , 140-8 from acoustic energy from the air moving devices 120-1, 120-2, 120-3, 120-4 along two sides extending along two dimensions.

In alternate embodiments, the baffle 150 may be configured to shield the one or more mechanical drives 140-1, 140-2, . . . , 140-8 from acoustic energy along a different number of sides, such as one, three, four, or more. For example, the one or more mechanical drives 140-1, 140-2, . . . , 140-8 may be alternately arranged away from a sidewall of the housing, and the baffle may include an additional, oppositely-arranged portion that extends past the one or more mechanical drives 140-1, 140-2, . . . , 140-8 along the predominant direction of the airflow.

In this way, the baffle 150 may be configured to provide a desired balance between mitigating the acoustic energy imparted to the airflow from the air moving devices 120-1, 120-2, 120-3, 120-4, and allowing sufficient airflow by the one or more mechanical drives 140-1, 140-2, . . . , 140-8 for cooling purposes. Beneficially, use of the baffle 150 may provide competitive advantages in terms of storage density (e.g., an increased number of mechanical drives 140-1, 140-2, . . . , 140-8 that may be included in the computing device 100), as well as the performance and reliability of the mechanical drives 140-1, 140-2, . . . , 140-8 during high-speed operation of the air moving devices 120-1, 120-2, 120-3, 120-4 and/or thermally stressful environments of the computing device 100. Additional implementation details of the baffle 150 are described with respect to FIGS. 5-9.

Figure 2:
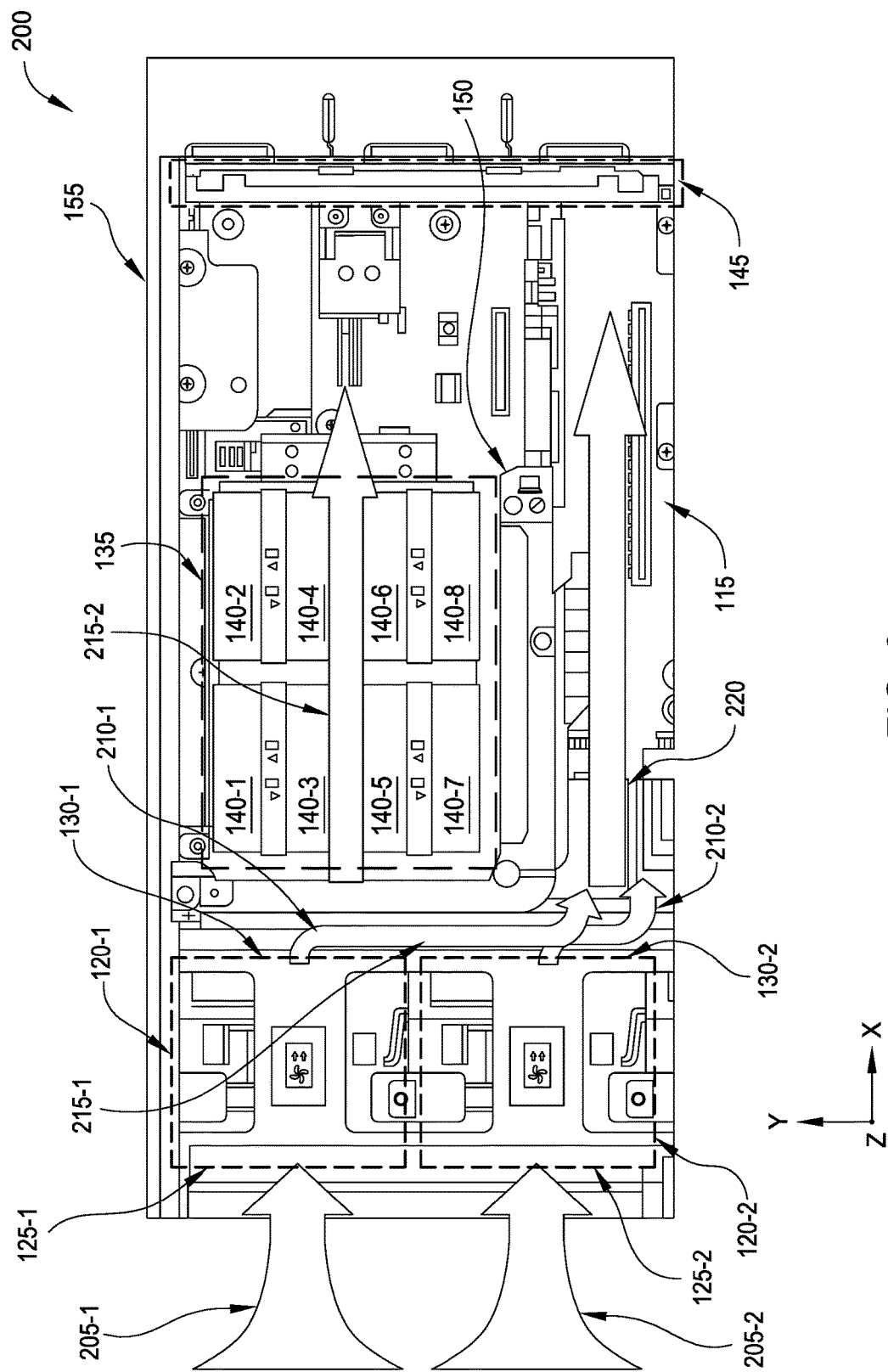
FIG. 2 is a diagram illustrating airflow through an exemplary computing device including a baffle, according to one or more embodiments.

A section 155 of the computing device 100 is depicted in diagram 200 of FIG. 2. The section 155 includes the air moving devices 120-1, 120-2, the one or more mechanical drives 140-1, 140-2, . . . , 140-8, and the baffle 150. The features discussed with respect to the diagram 200 may be used in conjunction with other embodiments, such as the computing device 100 of FIG. 1.

In the diagram 200, an air intake 205-1 is provided to an inlet 125-1 of the air moving device 120-1, and an air intake 205-2 is provided to an inlet 125-2 of the air moving device 120-2. An airflow 210-1 exits the air moving device 120-1 at the outlet 130-1. A first portion 215-1 of the airflow 210-1 is deflected in a lateral direction (as shown, along the Y-dimension) around the baffle 150. A second portion 215-2 of the airflow 210-1 passes through the baffle 150 and removes heat from the one or more mechanical drives 140-1, 140-2, . . . 140-8 before exiting the computing device 100 through the vents 145. As discussed above, the characteristics of the baffle 150 may be selected and/or adapted to provide a desired mitigation of one or more predefined components of the acoustic energy signature of the airflow 210-1 while permitting the second portion 215-2 to pass through the baffle 150. In some embodiments, the characteristics of the baffle 150 may be selected and/or adapted to provide a desired mass flow rate or volumetric flow rate of the second portion 215-2.

An airflow 210-2 exits the air moving device 120-2 at an outlet 130-2, and at least a portion of the airflow 210-2 is deflected around the baffle 150. The airflow 210-2 and the first portion 215-1 of the airflow 210-1 are mixed to provide an airflow 220 that exits the computing device 100 through the vents 145.

Figure 3:
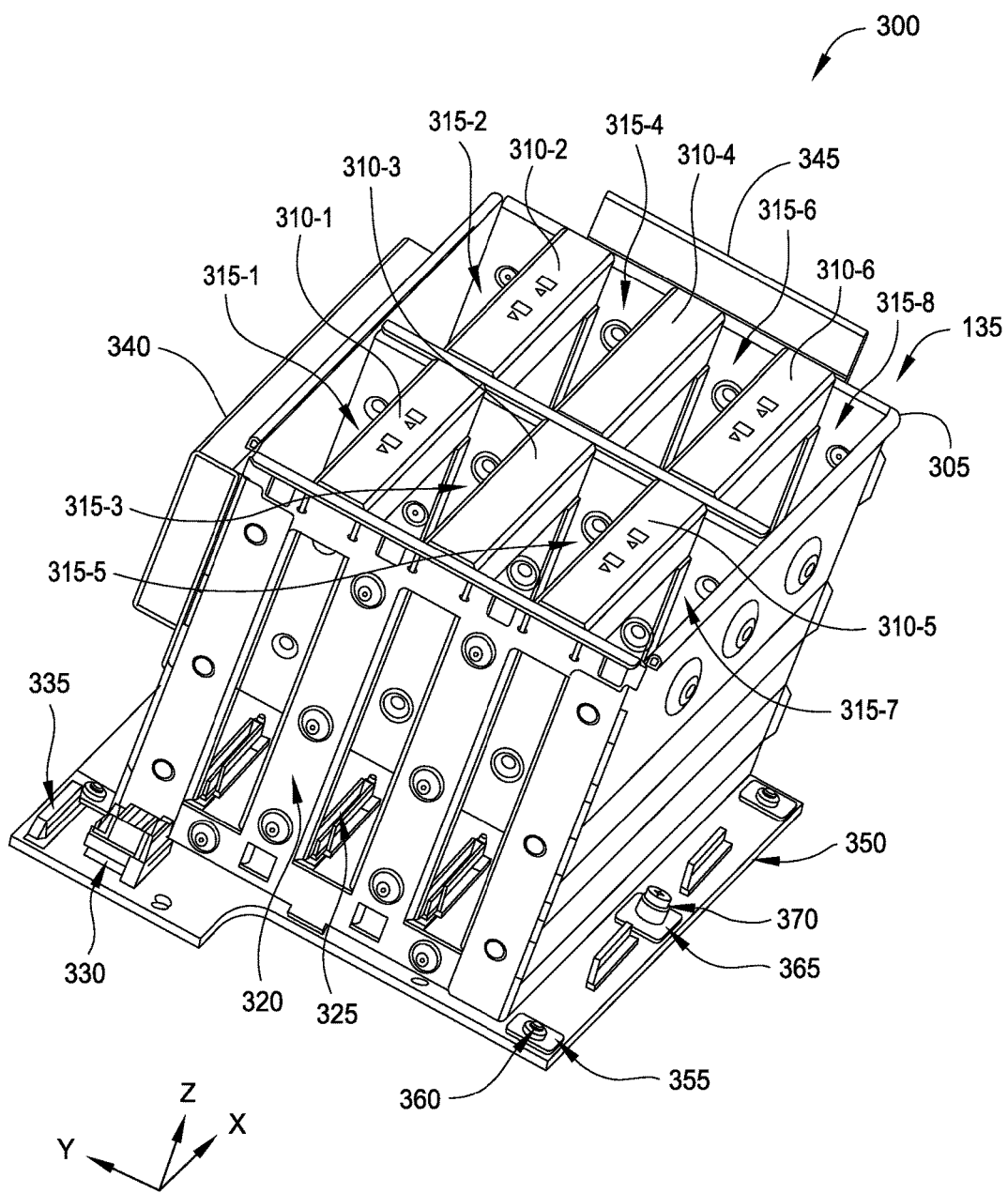
FIG. 3 is a diagram illustrating an exemplary drive cage for mounting a plurality of mechanical drives, according to one or more embodiments.

FIG. 3 is a diagram 300 illustrating an exemplary drive cage 135 for mounting a plurality of mechanical drives, according to one or more embodiments. The features discussed with respect to the diagram 300 may be used in conjunction with other embodiments, such as the computing device 100 of FIG. 1.

The drive cage 135 comprises a frame 305 connected with a plurality of spacers 310-1, 310-2, . . . , 310-6. The frame 305 may be implemented as a monolithic component or as an assembly of multiple components. The frame 305 may be constructed or formed from any material(s) suitable for supporting a plurality of mechanical drives with a predefined arrangement. For example, the frame 305 may comprise a metallic material.

The combination of the frame 305 and the spacers 310-1, 310-2, . . . , 310-6 define a plurality of openings 315-1, 315-2, . . . , 315-8, each of which is configured to receive a respective mechanical drive. While eight openings 315-1, 315-2, . . . , 315-8 are illustrated, alternate implementations may include any other suitable numbers of openings. The frame 305 may further comprise alignment features and/or retaining features for the mechanical drives. For example, a mechanical drive inserted into the opening 315-3 may be aligned by an alignment feature 320. When the mechanical drive is fully inserted, the alignment feature 320 arranges the mechanical drive to connect with a connector 325.

The drive cage 135 may include mounting brackets 340, 345 for coupling the frame with other components of the computing device. For example, the mounting brackets 340, 345 may couple with a housing and/or a structural member within the housing.

The drive cage 135 further comprises a circuit board 350 connected with the frame 305. A plurality of connectors are connected with the circuit board 350, such as connectors for each of the plurality of mechanical drives, as well as external connectors 330, 335 for communicatively coupling the plurality of mechanical drives with other components of the computing device.

The frame 305 comprises one or more tabs 355, 365 defining openings through which respective fasteners 360, 370 are inserted to rigidly connect the frame 305 with the circuit board 350. Additionally, the drive cage 135 may include one or more openings through which fasteners may be inserted for connecting the drive cage 135 with one or more surfaces of the computing device. For example, the circuit board 350 may define the one or more openings. In some embodiments, the drive cage 135 may be connected with the one or more surfaces to vibrationally isolate the drive cage 135 from other components of the computing device, such as the baffle 150 of FIGS. 1 and 2.

Figure 4:
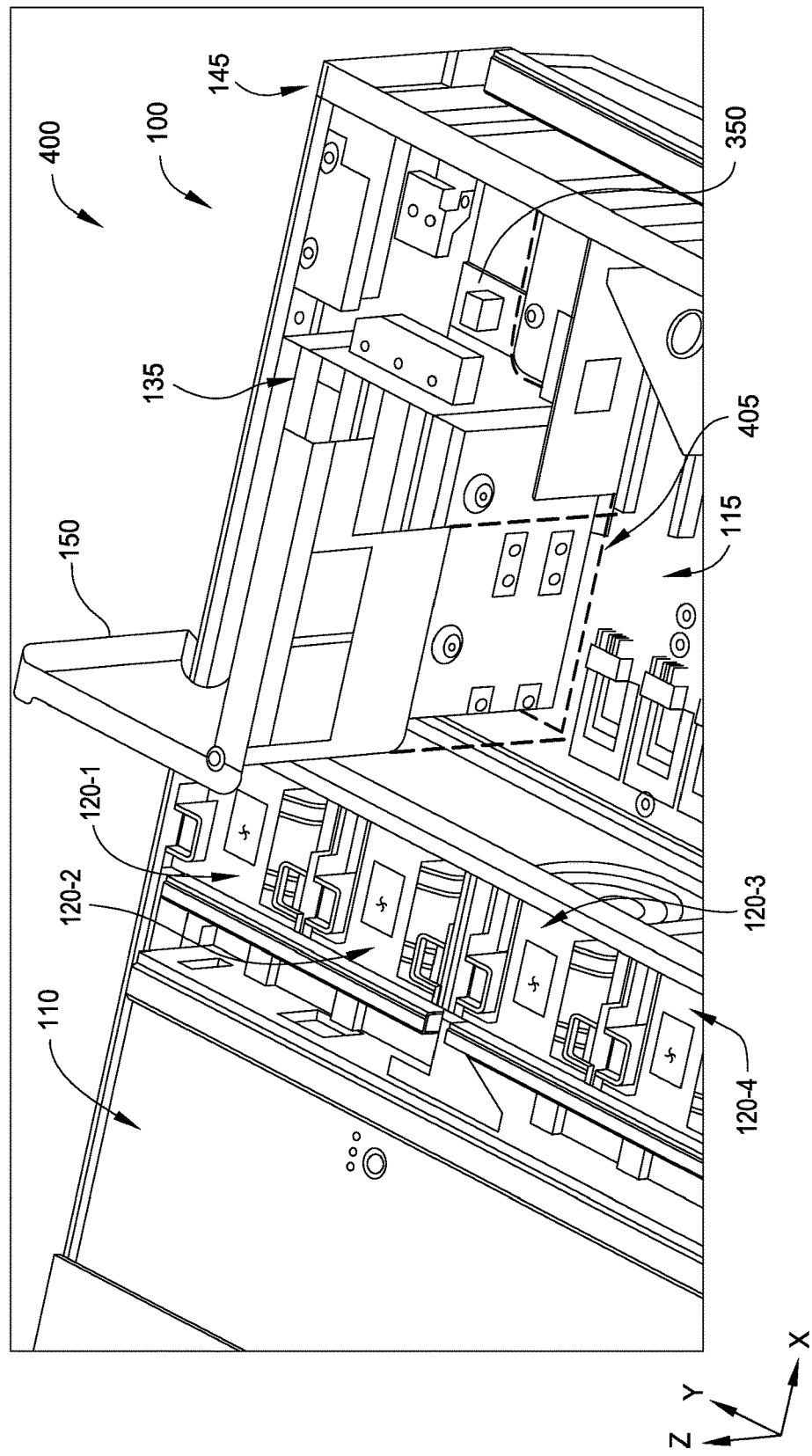
FIG. 4 is a diagram illustrating a partially exploded view of an exemplary computing device including a baffle, according to one or more embodiments.

FIG. 4 is a diagram 400 illustrating a partially exploded view of an exemplary computing device 100 including a baffle 150, according to one or more embodiments. More specifically, diagram 400 illustrates that the baffle 150 may be retrofitted to the computing device 100 in some implementations.

In some embodiments, the baffle 150 may be removably installed in the computing device 100. For example, in a first configuration of the computing device 100, the drive cage 135 may include a plurality of SSDs that are relatively insensitive to acoustic energy imparted to the airflow from the air moving devices 120-1, 120-2, 120-3, 120-4. In the first configuration, the baffle 150 may not be installed in the computing device 100. In a second configuration of the computing device 100, the drive cage 135 may include a plurality of HDDs that are more sensitive to the acoustic energy. In the second configuration, the baffle 150 may be installed in the computing device 100.

As discussed above, the baffle 150 may be connected with a first surface of the computing device 100, such as the circuit board 115. As shown by the outline 405 of the circuit board 115, the circuit board 115 is arranged at a different height in the Z-dimension than the circuit board 350 of the drive cage 135. In some embodiments, the circuit board 115 may be vibrationally isolated from the drive cage 135, e.g., using suitable damping materials.

Figure 5:
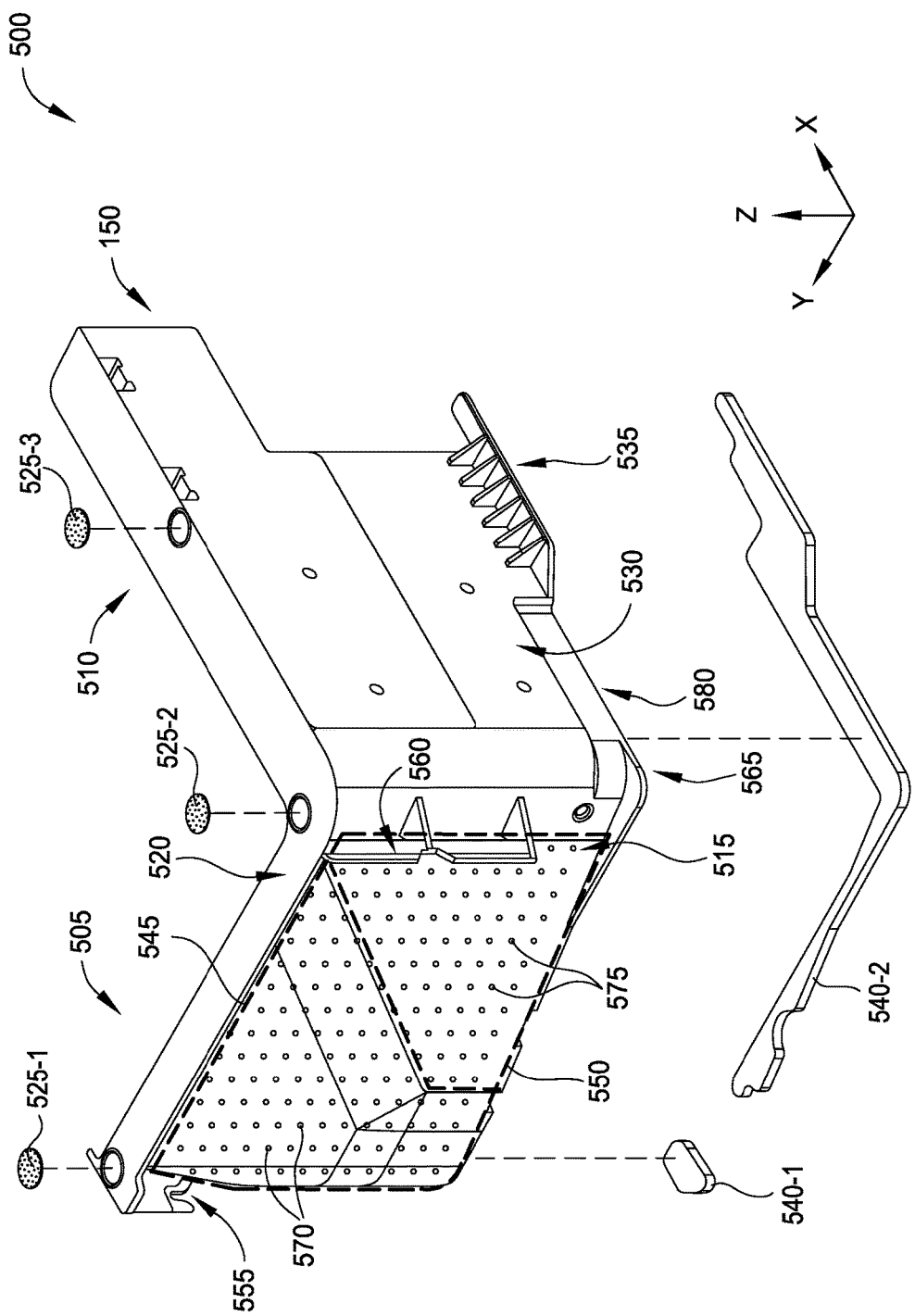
FIG. 5 is a diagram illustrating a partially exploded view of an exemplary baffle, according to one or more embodiments.

FIG. 5 is a diagram 500 illustrating a partially exploded view of an exemplary baffle 150, according to one or more embodiments. The features discussed with respect to the diagram 500 may be used in conjunction with other embodiments, such as the computing device 100 of FIG. 1.

The baffle 150 comprises a first portion 505 and a second portion 510. In some embodiments, the first portion 505 and the second portion 510 represent different components that are connected through a transition region 565. In other embodiments, the first portion 505 and the second portion 510 represent different portions of a monolithic component. Each of the first portion 505 and the second portion 510 may be formed of any suitable material(s). The baffle 150 may have any suitable dimensions for mitigating acoustic energy that will be incident on the mechanical drives. In one non-limiting example, the baffle 150 has an X-dimension of approximately 7.8 inches, and has a Y-dimension of approximately 6.6 inches.

The first portion 505 extends along the Y-dimension, which, when the baffle 150 is installed in a computing device, may be substantially perpendicular to a predominant direction of the airflow from air moving device(s). The second portion 510 extends along the X-dimension, which, when the baffle 150 is installed extends past one or more mechanical drives along the predominant direction of the airflow.

The first portion 505 defines a first surface 515. In some embodiments, the first surface 515 is contoured to deflect a portion of the airflow in a lateral direction (as shown, in the negative (−) Y-direction). For example, the first surface 515 may comprise raised portions (i.e., closer in the X-dimension to the air moving device(s)) and/or sloped portions.

Figure 7:
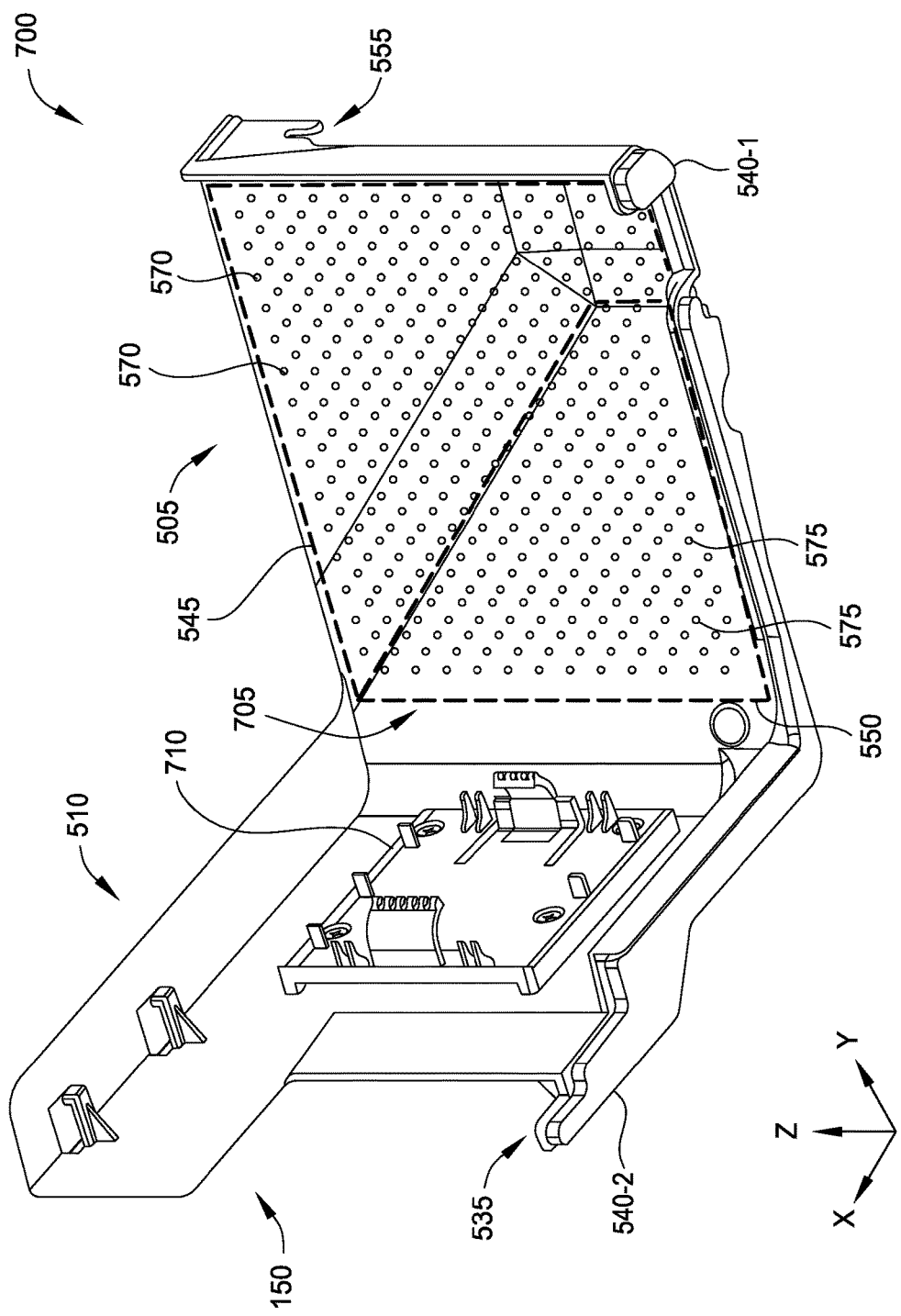
FIG. 7 is a diagram illustrating a view of an exemplary baffle, according to one or more embodiments.

The baffle 150 defines a plurality of perforations 570, 575 that extend between the first surface 515 and an opposing second surface (which is shown in FIG. 7 as second surface 705). In some embodiments, the plurality of perforations 570, 575 are dimensioned and arranged to mitigate one or more components of an acoustic energy signature of the airflow while permitting a portion of the airflow to pass through the baffle 150. In some embodiments, the plurality of perforations 570, 575 are substantially circular, but other shapes are also possible. In some embodiments, a diameter of the plurality of perforations 570, 575 is the same along an extent of the perforations 570, 575 between the first surface 515 and the second surface 705. In other embodiments, a diameter of the plurality of perforations 570, 575 increases or decreases along an extent of the perforations 570, 575 between the first surface 515 and the second surface 705.

In some embodiments, a plurality of first perforations 570 are arranged in a first region 545 of the first surface 515, and a plurality of second perforations 575 arranged in a second region 550 of the first surface 515. In some embodiments, the first perforations 570 have first dimensions and the second perforations 575 have different second dimensions. In other embodiments, the first perforations 570 may have substantially the same dimensions as the second perforations 575. Additional implementation details of the first perforations 570 and the second perforations 575 are described with respect to FIGS. 8 and 9.

The first portion 510 further comprises one or more alignment features and/or retaining features for the baffle 150. For example, the first portion 510 may comprise an alignment feature 555 configured to engage with a portion of the housing of the computing device, and/or an alignment feature 560 configured to engage with one or more structural members of the computing device. In some embodiments, the baffle 150 is not connected with (or vibrationally isolated from) mechanical drive(s) that are to be acoustically shielded by the baffle 150. In other embodiments, the baffle 150 may be connected with the mechanical drive(s) via damping methods and/or damping materials, which may substantially vibrationally isolate the baffle 150 from the mechanical drive(s).

The second portion 510 defines a surface 530 that extends along the X-dimension. The surface 530 as shown is substantially continuous; however, alternate implementations may include perforations similar to those of the first portion 505. In some embodiments, the second portion 510 further comprises a lateral support element 535 that is configured to provide lateral support to the second portion 510 through the surface 530.

The transition region 565 may have any suitable dimensions for transitioning between the first portion 505 and the second portion 510. In some embodiments, the transition region 565 has a radius of curvature selected to present a low resistance for airflow being deflected around the baffle 150.

The baffle 150 further comprises a third surface 580 extending between the first surface 515 and the second surface. As shown, the third surface 580 comprises a bottom surface of the baffle 150, and is defined along both of the first portion 505 and the second portion 510 (including the lateral support element 535).

In some embodiments, the third surface 580 is connected via a compressible damping material (shown as damping elements 540-1, 540-2) with a surface of the computing device. The damping elements 540-1, 540-2 may be formed of any damping material(s) suitable for damping the acoustic energy of airflow incident on the baffle 150. In some embodiments, the damping elements 540-1, 540-2 are formed of a cellular silicone foam. In some embodiments, contours of the damping elements 540-1, 540-2 substantially follow the contours of the third surface 580. Further, although two damping elements 540-1, 540-2 are shown, different numbers of damping elements may be used in alternate implementations, such as a single damping element, or three or more damping elements. For example, the space between the damping elements 540-1, 540-2 may be dimensioned to accommodate portions of the computing device, such as a connector or cable. In this way, the baffle 150 may be retrofitted to existing configurations of computing devices.

The baffle 150 further comprises a fourth surface 520 opposing the third surface 580. As shown, the fourth surface 520 comprises a top surface of the baffle 150, and is defined along both of the first portion 505 and the second portion 510. One or more compressible features 525-1, 525-2, 525-3 are disposed at the fourth surface 520. The one or more compressible features 525, 525-2, 525-3 may be formed of any damping material(s) suitable for damping the acoustic energy of airflow incident on the baffle 150, e.g. a cellular silicone foam.

In some embodiments, when the baffle 150 is installed in the computing device, a compression force is applied across the baffle 150 in the Z-dimension. For example, the housing of the computing device may comprise a removably installed lid component. The lid component, when installed, compresses the damping elements 540-1, 540-2 and the one or more compressible features 525-1, 525-2, 525-3. Beneficially, the use of the damping elements 540-1, 540-2 and the one or more compressible features 525-1, 525-2, 525-3 allows the baffle 150 to further dampen acoustic energy of the airflow through absorption.

Figure 6:
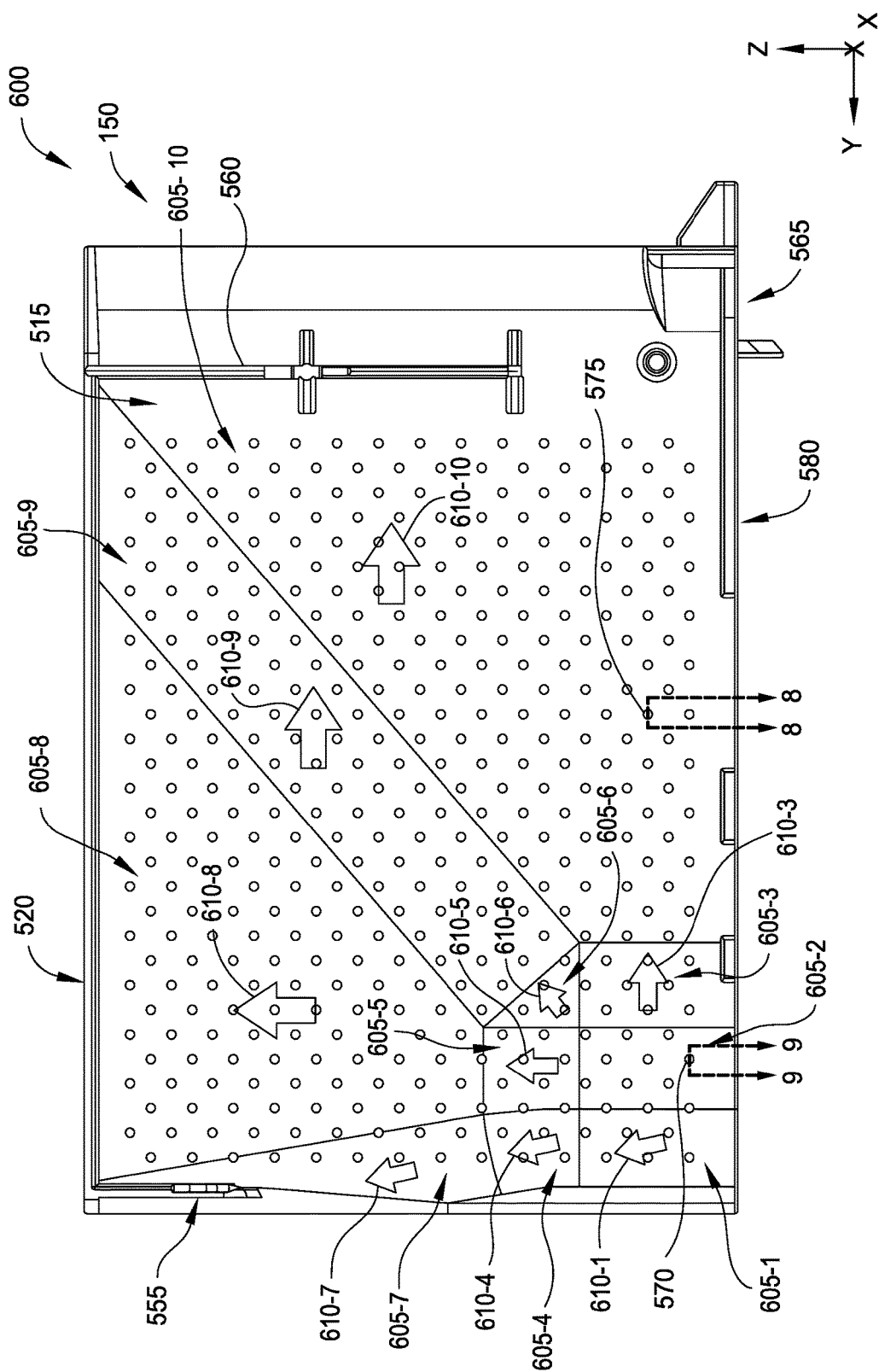
FIG. 6 is a diagram illustrating a view of an exemplary baffle, according to one or more embodiments.

FIG. 6 is a diagram 600 illustrating a view of an exemplary baffle 150, according to one or more embodiments. The features discussed with respect to the diagram 600 may be used in conjunction with other embodiments, such as the computing device 100 of FIG. 1.

As discussed above, the first surface 515 of the baffle 150 may be contoured to deflect a portion of the airflow in a lateral direction around the baffle 150. The first surface 515 of the baffle 150 comprises a plurality of regions 605-1, 605-2, . . . 605-10. The region 605-1 has a slope indicated by an arrow 610-1, the region 605-3 has a slope indicated by an arrow 610-3, and so forth. Each arrow 610-1, 610-3, . . . 610-10 generally points in a direction of increasing values in the X-direction. For example, from its border with the region 605-5, the region 605-8 slopes down (i.e., increasing X-direction values) as it approaches the fourth surface 520. The region 605-2 may comprise a raised region (i.e., extending further in the negative (−) X-direction) that is substantially flat.

Generally, the plurality of regions 605-1, 605-2, . . . , 605-10 enable a first portion of the airflow to be deflected in the negative (−) Y-direction to be directed around the baffle 150. A pattern of the plurality of perforations 570, 575 included in the baffle 150 enables a second portion of the airflow to pass through the baffle 150. As shown, the plurality of perforations 570, 575 are arranged in a repeating arrangement comprising staggered rows, though other suitable repeating and non-repeating configurations are also possible. In some embodiments, a distance between adjacent perforations 570, 575 in a row is the same as a distance between adjacent perforations 570, 575 in a column. However, other spacing values are also possible.

FIG. 7 is a diagram 700 illustrating a view of an exemplary baffle, according to one or more embodiments. The features discussed with respect to the diagram 700 may be used in conjunction with other embodiments, such as the computing device 100 of FIG. 1.

As shown, damping elements 540-1, 540-2 are connected with the baffle 150. The diagram 700 shows the second surface 705, which opposes the first surface 515 of FIG. 5. The baffle 150 further comprises a support bracket 710 connected with the second portion 510. The support bracket 710 is configured to engage with and provide support to one or more components of the computing device. In some embodiments, the support bracket 710 is isolated from the drive cage and/or the mechanical drive(s) being shielded by the baffle 150.

Figure 8:
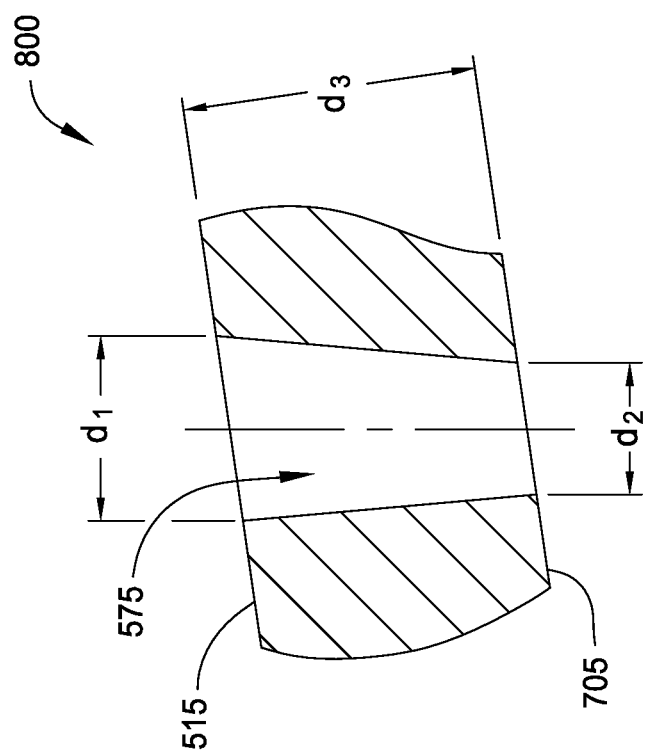
FIG. 8 is a diagram illustrating a cross-section view of an exemplary perforation, according to one or more embodiments.

FIG. 8 is a diagram 800 illustrating a cross-section view of an exemplary perforation 575, according to one or more embodiments. The features discussed with respect to the diagram 800 may be used in conjunction with other embodiments, such as the computing device 100 of FIG. 1.

As discussed above, the first perforations 570 of the baffle 150 may have first dimensions and the second perforations 575 may have different second dimensions. In some embodiments, a contour of the second perforation 575 tapers from the first surface 515 to the second surface 705. Stated another way, the second perforation 575 has a first diameter $d_1$ at the first surface 515 and a second diameter $d_2$ at the second surface 705, where $d_1 > d_2$. In one non-limiting example, the first diameter $d_1$ is approximately 0.063 inches (63 mils) and the second diameter $d_2$ is approximately 0.040 inches (40 mils). In this example, a thickness $d_3$ of the baffle 150 is approximately 0.125 inches. Other dimensions of the baffle 150 and/or the second perforation 575 are also possible, for example, based on airflow requirements through the baffle 150 and or one or more frequencies to be mitigated by the baffle 150.

Figure 9:
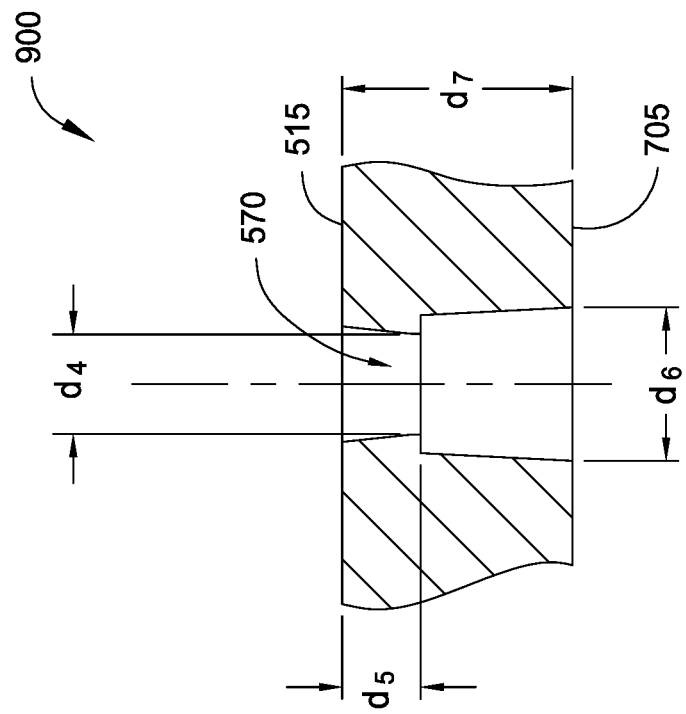
FIG. 9 is a diagram illustrating a cross-section view of an exemplary perforation, according to one or more embodiments.

FIG. 9 is a diagram 900 illustrating a cross-section view of an exemplary perforation 570, according to one or more embodiments. The features discussed with respect to the diagram 900 may be used in conjunction with other embodiments, such as the computing device 100 of FIG. 1.

In some embodiments, a contour of the first perforation 570 expands from the first surface 515 to the second surface 705. Stated another way, the second perforation 575 has a first diameter $d_4$ at the first surface 515 and a second diameter $d_6$ at the second surface 705, where $d_4 < d_6$. In one non-limiting example, the first diameter $d_4$ is approximately 0.040 inches (40 mils) and the second diameter $d_6$ is approximately 0.059 inches (59 mils). The contour of the first perforation 570 may have first and second portions that are defined, e.g., according to a stepwise function. For example, the first portion extends from the first surface 515 to a depth $d_5$ of approximately 0.042 inches (42 mils). The second portion extends from the depth $d_5$ to the second surface 705, and has a larger diameter at the depth $d_5$ than that of the first portion. In this example, a thickness $d_7$ of the baffle 150 is approximately 0.125 inches at the first perforation 570. Other dimensions of the baffle 150 and/or the first perforation 570 are also possible, for example, based on airflow requirements through the baffle 150 and or one or more frequencies to be mitigated by the baffle 150.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A computing device comprising:
    an air moving device operable to produce an airflow that removes heat from a first set of one or more components of the computing device that are arranged upstream from the air moving device, wherein the airflow corresponds to an acoustic energy signature;
    one or more mechanical drives that are arranged downstream from the air moving device; and
    a baffle disposed between the air moving device and the one or more mechanical drives,
        wherein the baffle defines a plurality of perforations extending between a first surface and an opposing second surface, and
        wherein the plurality of perforations are dimensioned and arranged to mitigate a second set of one or more predefined components of the acoustic energy signature of the airflow while permitting a first portion of the airflow to pass through the baffle to remove heat from the one or more mechanical drives.

2. The computing device of claim 1, wherein the plurality of perforations are dimensioned and arranged to mitigate one or more frequencies corresponding to resonances or other critical frequencies associated with the one or more mechanical drives.

3. The computing device of claim 1, wherein the first surface is contoured to deflect a second portion of the airflow around the baffle to exit the computing device through one or more vents.

4. The computing device of claim 3, wherein the baffle comprises:
    a first portion that defines the first surface and the second surface, wherein the first portion is substantially perpendicular to a predominant direction of the airflow from the air moving device; and
    a second portion connected with the first portion and extending past the one or more mechanical drives in the predominant direction of the airflow.

5. The computing device of claim 1, wherein a diameter of the plurality of perforations is the same along an extent of the perforations between the first surface and the second surface.

6. The computing device of claim 1, wherein a diameter of the plurality of perforations increases or decreases along an extent of the perforations between the first surface and the second surface.

7. The computing device of claim 1, wherein the baffle further comprises a third surface extending between the first surface and the second surface, and
    wherein the third surface is connected, via a compressible damping material, with a first surface of the computing device.

8. The computing device of claim 7, wherein the one or more mechanical drives are arranged in a drive cage that is vibrationally isolated from the first surface.

9. The computing device of claim 7, wherein the baffle further comprises a fourth surface opposing the third surface, wherein one or more compressible features are disposed at the fourth surface.

10. The computing device of claim 9, further comprising:
    a housing comprising a removably installed lid component,
    wherein the lid component, when installed, compresses the compressible damping material and the one or more compressible features.

11. A computing device comprising:
    an air moving device operable to produce an airflow within a housing, wherein the airflow corresponds to an acoustic energy signature;
    a first set of one or more components proximately disposed to an inlet of the air moving device, wherein the airflow removes heat from the first set of the one or more components;
    one or more mechanical drives proximately disposed to an outlet of the air moving device, wherein the one or more mechanical drives are connected with a first surface within the housing; and
    a baffle disposed between the air moving device and the one or more mechanical drives, wherein the baffle is connected via a compressible damping material with a second surface that is vibrationally isolated from the first surface, wherein the baffle is configured to mitigate a second set of one or more predefined components of the acoustic energy signature of the airflow while permitting a first portion of the airflow to pass through the baffle to remove heat from the one or more mechanical drives.

12. The computing device of claim 11, wherein the baffle further comprises one or more compressible features, wherein the housing comprises a removably installed lid component, and wherein the lid component, when installed, compresses the compressible damping material and the one or more compressible features.

13. The computing device of claim 11, wherein mitigating one or more predefined components of the acoustic energy signature of the airflow comprises mitigating one or more frequencies corresponding to resonances or other critical frequencies associated with the one or more mechanical drives.

14. The computing device of claim 11, wherein the one or more mechanical drives are arranged in a drive cage that is connected with the first surface.

15. The computing device of claim 11, wherein the first surface comprises a circuit board of the computing device.

16. The computing device of claim 11, wherein a first surface of the baffle is contoured to deflect a second portion of the airflow around the baffle to exit the computing device through one or more vents.

17. The computing device of claim 16, wherein the baffle comprises:

a first portion that defines the first surface and an opposing second surface, wherein the first portion is substantially perpendicular to a predominant direction of the airflow from the air moving device; and a second portion connected with the first portion and extending past the one or more mechanical drives in the predominant direction.

18. The computing device of claim 16, wherein the baffle defines a plurality of perforations extending between the first surface and an opposing second surface, and wherein the plurality of perforations are dimensioned and arranged to mitigate one or more predefined components of the acoustic energy signature of the airflow while permitting the first portion of the airflow to pass through the baffle.

19. The computing device of claim 18, wherein a diameter of the plurality of perforations is the same along an extent of the perforations between the first surface and the second surface.

20. The computing device of claim 18, wherein a diameter of the plurality of perforations increases or decreases along an extent of the perforations between the first surface and the second surface.

* * * * *